(12) United States Patent
Chaleix et al.

(10) Patent No.: US 9,051,642 B2
(45) Date of Patent: Jun. 9, 2015

(54) PROCESS FOR COATING A SUBSTRATE, PLANT FOR IMPLEMENTING THE PROCESS AND FEEDER FOR FEEDING SUCH A PLANT WITH METAL

(75) Inventors: Daniel Chaleix, Verny (FR); Daniel Jacques, Thionville (FR); Florent Sponem, Florange (FR)

(73) Assignee: ArcelorMittal France, Saint Denis (FR)

( * ) Notice: Subject to any disclaimer, the term of this patent is extended or adjusted under 35 U.S.C. 154(b) by 1080 days.

(21) Appl. No.: 12/523,211

(22) PCT Filed: Jan. 16, 2008

(86) PCT No.: PCT/FR2008/000046
§ 371 (c)(1),
(2), (4) Date: Oct. 19, 2009

(87) PCT Pub. No.: WO2008/107538
PCT Pub. Date: Sep. 12, 2008

(65) Prior Publication Data
US 2010/0068412 A1    Mar. 18, 2010

(30) Foreign Application Priority Data

Jan. 16, 2007 (EP) .................................. 07290054

(51) Int. Cl.
| | |
|---|---|
| C23C 16/00 | (2006.01) |
| C23C 14/22 | (2006.01) |
| C23C 14/24 | (2006.01) |
| C23C 14/34 | (2006.01) |
| C23C 14/35 | (2006.01) |
| C23C 14/56 | (2006.01) |
| H01J 37/32 | (2006.01) |
| H01J 37/34 | (2006.01) |

(52) U.S. Cl.
CPC ................. *C23C 14/22* (2013.01); *C23C 14/24* (2013.01); *C23C 14/246* (2013.01); *C23C 14/3457* (2013.01); *C23C 14/35* (2013.01); *C23C 14/562* (2013.01); *H01J 37/3277* (2013.01); *H01J 37/3408* (2013.01)

(58) Field of Classification Search
USPC .................................................. 118/726, 727
See application file for complete search history.

(56) References Cited

U.S. PATENT DOCUMENTS

| | | | | |
|---|---|---|---|---|
| 3,020,177 | A | * 2/1962 | Alexander | .................... 427/251 |
| 3,329,524 | A | * 7/1967 | Smith, Jr. | ....................... 427/597 |
| 4,676,194 | A | * 6/1987 | Satou et al. | .................... 118/720 |
| 5,135,817 | A |   8/1992 | Shimogori et al. | |
| 5,230,923 | A |   7/1993 | Hirokawa et al. | |

(Continued)

FOREIGN PATENT DOCUMENTS

| | | | |
|---|---|---|---|
| CN | 1515700 | 7/2004 | |
| CN | 1648279 | 8/2005 | |
| EP | 0780486 | 6/1997 | |
| JP | 61147260 | 9/1986 | |
| JP | 61263008 | 11/1986 | |
| JP | 62238358 | * 10/1987 | ............... C23C 2/00 |
| JP | 63 50472 | 3/1988 | |
| JP | 6473074 | 3/1989 | |
| JP | 05179424 | 7/1993 | |
| JP | 05255854 | 10/1993 | |
| JP | 2001207255 | 7/2001 | |
| JP | 2008513595 | 5/2008 | |
| UA | 17473 | 5/1997 | |

*Primary Examiner* — Keath Chen
(74) *Attorney, Agent, or Firm* — Davidson, Davidson & Kappel, LLC

(57) ABSTRACT

A coating process for coating at least one side of a running substrate, by vacuum evaporation, with a layer of a sublimable metal or metal alloy, in which said metal or metal alloy is positioned so as to face said side of the substrate in the form of at least two ingots placed in contact with one another, that surface of said ingots facing said side of the substrate being kept parallel to the substrate and at a constant distance from the latter during coating, and also to a coating plant for implementing the process and to a feeder for supply.

21 Claims, 3 Drawing Sheets

(56) References Cited

U.S. PATENT DOCUMENTS

| | | | |
|---|---|---|---|
| 5,795,628 A * | 8/1998 | Wisard et al. | 427/566 |
| 5,834,070 A | 11/1998 | Movchan et al. | |
| 5,983,976 A * | 11/1999 | Kono | 164/113 |
| 6,136,095 A * | 10/2000 | Xu et al. | 118/719 |
| 7,062,348 B1 * | 6/2006 | Folta | 700/118 |
| 2005/0061250 A1 | 3/2005 | Grechanyuk et al. | |
| 2005/0244580 A1 * | 11/2005 | Cok et al. | 427/248.1 |
| 2006/0177596 A1 | 8/2006 | De Meyer et al. | |

\* cited by examiner

PROCESS FOR COATING A SUBSTRATE, PLANT FOR IMPLEMENTING THE PROCESS AND FEEDER FOR FEEDING SUCH A PLANT WITH METAL

The present invention relates to a process for coating a running substrate, more particularly for coating steel strip with layers based on metallic elements such as, for example, magnesium, but without being in any way restricted thereto.

BACKGROUND

Various processes are known for depositing, on a running substrate, such as a steel strip, metallic coatings consisting of a layer of metal, or several successive layers of different metals, or else metal alloys. Among these processes, mention may be made of hot-dip galvanizing and electrodeposition, or indeed the various vacuum deposition (magnetron sputtering, Joule evaporation, electron bombardment and SIP (self-induced plasma)) processes.

Vacuum deposition processes have the advantage of being environmentally friendly and of enabling virtually all known elements, but also alloys, to be deposited. When it is desired for a metallic layer to be continuously deposited on a running substrate, the problem of how to feed the deposition chamber with the metal to be deposited then arises.

A first type of coating plant is known in which the metal to be deposited is kept in liquid form by being melted in a furnace before being conveyed to the deposition zone, for example by means of a pump or else by the barometer principle. However, this type of plant is not suitable for depositing metallic elements that sublime, i.e. those which pass directly from the solid phase to the vapour phase.

A second type of coating plant is known in which the metal to be deposited is in solid form, such as for example in the form of wires, which are introduced in a regular manner therein, or else in the form of granules, which are placed inside an inert graphite crucible. These plants are able to deposit metallic elements that sublime, but the deposition process is unstable, resulting in non-uniform coating thicknesses over the course of time, and is limited in terms of heating power, preventing sufficiently high deposition rates from being achieved.

SUMMARY OF THE INVENTION

It is an object of the present invention to provide a process for coating a running substrate with a sublimable metal or metal alloy that allows stable operation over time at a high deposition rate.

The present invention provides a coating process for coating at least one side of a running substrate, by vacuum evaporation, with a layer of a sublimable metal or metal alloy, in which said metal or metal alloy is positioned so as to face said side of the substrate in the form of at least two ingots placed in contact with one another, that surface of said ingots facing said side of the substrate being kept parallel to the substrate and at a constant distance from the latter during coating.

The process according to the invention may also include various features, taken individually or in combination:

the ingots of a sublimable metal or metal alloy may be moved simultaneously, either continuously or sequentially, so as to keep their surfaces facing the substrate parallel to and at a constant distance from the latter;

the ingots of a sublimable metal or metal alloy may be moved simultaneously by translation, the opposite surface of the ingots from that facing the substrate being in contact with an inclined plane;

the ingots may be moved simultaneously by translation in a plane parallel to the plane in which the substrate runs and in a direction perpendicular to the direction in which the substrate runs, the opposite surface of the ingots from that facing the substrate being in contact with an inclined plane;

the ingots may be moved simultaneously by translation in a plane parallel to the plane in which the substrate runs and in a direction parallel to the direction in which the substrate runs, the opposite surface of the ingots from that facing the substrate being in contact with an inclined plane;

the substrate may run vertically, the ingots being stacked one on top of another;

the substrate may be coated by vacuum evaporation on both its sides with a layer of a sublimable metal or metal alloy, the metal or metal alloy being positioned so as to face each side of the substrate in the form of at least two ingots placed in contact with one another, that surface of the ingots facing each side of the substrate being kept parallel to and at a constant distance from the side of the substrate during coating;

the metal or metal alloy may be the same or different for each side of the substrate;

the vacuum evaporation process may be deposition by plasma-enhanced evaporation, such as deposition by SIP (self-induced plasma) evaporation;

the metal or metal alloy may be chosen from zinc, magnesium, chromium, manganese, silicon and alloys thereof and is preferably magnesium or one of its alloys;

the deposition by vacuum evaporation may be carried out in a reactive atmosphere; and the running substrate may be a steel strip, possibly already coated beforehand, and preferably a steel strip which has been coated beforehand with zinc or a zinc alloy and on which a layer of magnesium or magnesium alloy is deposited.

A second subject of the invention is a coating plant for continuously coating a substrate S on at least one of its sides with a layer of a sublimable metal or metal alloy, comprising a vacuum chamber containing:

a vacuum evaporation coater;

means for making said substrate S run through the coater; and a feeder 1, 11, 21 for feeding the coater with a metal or metal alloy, said metal or metal alloy being in the form of ingots L1, . . . , Ln, L'1, . . . , L'n and comprising means for keeping said ingots L1, . . . , Ln, L'1, . . . , L'n in contact with one another and for keeping that surface of the ingots L1, . . . , Ln, L'1, . . . , L'n facing the side of the substrate S to be coated parallel to and at a constant distance from the substrate S.

The plant according to the invention may also comprise the following embodiments, taken individually or in combination:

the feeder 1, 11, 21 may comprise means for simultaneously moving the ingots L1, . . . , Ln, L'1, . . . , Ln sequentially or continuously so as to keep their surfaces facing the substrate S parallel to and at a constant distance from the latter;

the feeder 11 may comprise at least one inclined plane 2, 2' with which the ingots L1, . . . , Ln, L'1, . . . , L'n are in contact via their side opposite that facing the substrate S, the means for moving the ingots L1, . . . , Ln, L'1, . . . , L'n enabling them to be moved by translation in a plane parallel to the plane in which the substrate S runs and in a direction perpendicular to the direction in which the substrate S runs, and the inclination of the inclined plane 2, 2' increasing in the direction of movement of the ingots L1, . . . , Ln, L'1, . . . , L'n;

the means for moving the ingots L1, ..., Ln, L'1, ..., L'n may consist of at least one piston 3, 3' acting on a first ingot L1, L'1 in contact with a first end of the inclined plane 2, 2', and extending transversely relative to the substrate S, the first ingot L1, L'1 acting in turn on the ingots L2, ..., Ln, L'2, ..., L'n preceding it on said inclined plane 2, 2' as far as its second end;

the plant may have a first inclined plane 2 provided with ingots L1, ..., Ln and with a first piston 3 acting on the first ingot L1 in contact with the first end of the first inclined plane 2 and a second inclined plane 2' provided with ingots L'1, ..., L'n and with a second piston 3' acting on the first ingot L'1 in contact with the first end of the second inclined plane 3', it being possible for said pistons 3, 3' to act in the same direction or in opposed directions;

the plant may comprise two tanks 4 for recovering, by gravity, the spent ingots U, said tanks being placed beneath each second end of the inclined planes 2, 2';

the feeder 11, 21 may have at least one inclined plane 12, 22 with which the ingots L1, ..., Ln are in contact via their side opposite that facing the substrate S, the means for moving the ingots enabling them to be moved by translation in a plane parallel to the plane in which the substrate S runs and in a direction parallel to the direction in which the substrate S runs, and the inclination of the inclined plane 12, 22 increasing in the direction of movement of the ingots L1, ..., Ln;

the means for moving the ingots L1, ..., Ln may consist of at least one piston 13, 23 acting on a first ingot L1 in contact with a first end of the inclined plane 12, 22, and extending longitudinally relative to the substrate S, the first ingot L1 acting in turn on the ingots L2, ..., Ln preceding it on the inclined plane 12, 22 as far as its second end;

the plant may comprise a tank for recovering, by gravity, the spent ingots, said tank being placed beneath the second end of the inclined plane 12, 22;

the substrate S may run vertically, the feeder 21 comprising at least one vertical plate 24 on which the ingots L1, ..., Ln are stacked, said plate being in contact with at least one vertical piston 23;

the plant may comprise a feeder 1, 11, 21 facing each side of the substrate S, it being possible for each feeder 1, 11, 21 to contain an identical or different metal or metal alloy, and a vacuum evaporator facing each side of the substrate S, the assembly being placed within the same vacuum chamber;

the plant may include means for introducing a reactive atmosphere into the vacuum chamber;

the vacuum evaporator(s) may be plasma-enhanced evaporation deposition devices, such as a device for deposition by self-induced plasma (SIP) evaporation; and the ingots L1, ..., Ln, L'1, ..., L'n of a metal or metal alloy may be chosen from zinc, magnesium, chromium, manganese, silicon and alloys thereof.

A third subject of the invention is a feeder 1, 11, 21 for feeding a vacuum coating plant as defined above with a metal or metal alloy.

BRIEF DESCRIPTION OF THE DRAWINGS

Other features and advantages of the invention will become apparent on reading the following description, given solely by way of example and with reference to the appended drawings which represent.

DETAILED DESCRIPTION

Within the context of the present invention, the term "evaporation process" is understood to mean any deposition process by evaporation at a pressure below atmospheric pressure. Preferably, the evaporation will be carried out by the SIP (self-induced plasma) process in which vacuum evaporation is combined with magnetron sputtering.

This process consists in creating a plasma between a substrate and a crucible containing the material to be deposited, in a gas for generating radicals and/or ions. Under normal operating conditions, these ions will be accelerated onto the surface of the material to be deposited on the substrate and tear off surface atoms, which are then deposited on the substrate. At the same time, the bombardment of the ions created in the plasma heats up the material to be deposited, enabling an evaporation process to be added to the magnetron sputtering. The reader may refer in particular to patent EP 780 486 for more details about the implementation of this process.

The substrate to be coated moves through a vacuum chamber facing the crucible containing the material to be deposited. The crucible is negatively biased relative to the substrate, the latter preferably being earthed. An array of magnets positioned behind the crucible confines the plasma created therein. In order for the substrate to be coated to be positioned very precisely with respect to the crucible, the substrate is generally placed on a support roll, which may be rotated about its axis. However, this type of roll is unnecessary when substrates in rigid plate form, such as thick metal plates or glass plates, are treated.

The process according to the invention therefore consists in depositing a layer of a metal or metal alloy on a running substrate.

This process applies more particularly, but not solely, to the treatment of steel strip, preferably strip coated with zinc or a zinc alloy. The term "zinc alloy" is understood to mean any compound comprising at least 50% zinc and able to contain, for example, aluminum, iron, silicon, etc.

This prior coating may be obtained by any known galvanizing process, whether for example hot-dip galvanizing, electrodeposition or deposition by vacuum evaporation. However, vacuum deposition processes are preferred.

The coating deposited within the context of the present invention is a metallic coating based on elements that can sublime during their deposition by vacuum evaporation. In particular, this covers elements such as zinc, magnesium, chromium, manganese and silicon, for example. It is particularly preferable to deposit magnesium on a strip precoated with zinc after which a diffusion treatment may be carried out by any suitable means, so as in the end to obtain a Zn—Mg coating having, in particular, a high performance in terms of corrosion resistance.

The present inventors firstly conducted evaporation trials on a static bulk magnesium ingot facing a steel strip running through a SIP vacuum deposition plant.

Figure 1:
FIG. 1: a sectional view of a metal ingot employed by a process according to the prior art.

After a certain operating time, it was observed that the coating deposited did not have a uniform thickness and that the deposition rate was relatively low. The deposition therefore had to be interrupted, making it possible to observe the state of the ingot, a representation of which is reproduced in FIG. 1.

It may be seen that the wear of the ingot is very irregular and to particularly accentuated in line with the high-magnetic-field zone. Without wishing to be tied to one particular theory, the present inventors consider that the instability of the deposition process is directly due to the irregular wear of the ingot.

To stabilize the process, the inventors therefore split the bulk ingot into at least two ingots and kept the top sides of these ingots parallel to and at a constant distance from the substrate to be coated, continuously or sequentially compensating for the wear due to evaporation.

Figure 2:
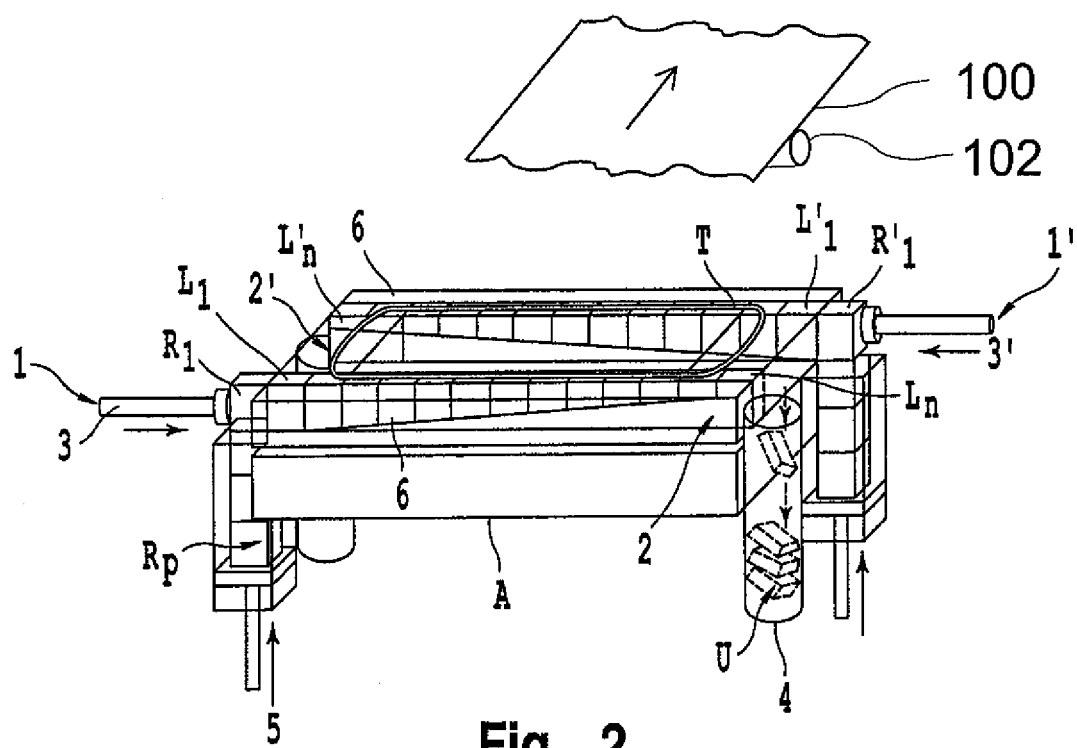
FIG. 2: a perspective view of a first embodiment of a plant according to the invention.

For this purpose, a first coating plant according to the invention using the SIP process was developed, this being partly reproduced in FIG. 2 in which a feeder 1 may be seen.

The feeder is placed beneath the substrate to be coated, shown schematically as 100, which runs horizontally, for example on a support roll 102, above the system of magnets A for confining the magnetic field, these being placed in a water box. A counterelectrode (not shown) is placed beneath the feeder 1 and a plasma is created by discharge between the counterelectrode/magnets assembly and the steel strip. To make the system easier to understand, the preferential erosion zone has been shown by means of a circuit T, which represents the zone where the magnetic field is intense.

The feeder 1 comprises a first inclined plane 2, the inclination of which increases from left to right. This inclined plane may be made of any appropriate material, provided that it is not liable to be sputtered during the operation, which would contaminate the coating obtained. This first inclined plane 2 could for example be made of tungsten.

A series of n ingots L1 to Ln is placed on this inclined plane 2, these being in contact with one another and their heights decreasing from left to right. The inclination of the inclined plane 2 is adapted so as to compensate for the wear of the ingots L1 to Ln, in such a way that the top sides of the ingots L1 to Ln remain mutually parallel and parallel to the substrate to be coated that is running above the device 1, perpendicular to the inclined plane 2. A constant distance is thus maintained between the magnets and the top side of the ingots, and also a constant distance between the top side of the ingots and that side of the substrate to be coated. The reason for this is that, to obtain the most homogeneous plasma possible, it is important for the distance between electrodes (consisting here of the ingots on the one hand and the substrate on the other) to be as constant as possible. It is also just as important for the distance between the magnets of the magnetron and the top side of the ingots to remain constant. If these conditions are not met, owing to consumption of the ingots, at any point on their top side, the plasma will be locally intensified or diminished, generating instabilities in this plasma, and thus instabilities in the evaporation.

The use of an inclined plane 2 thus makes it possible to obtain a very stable plasma at every point in the evaporation zone.

Provided on either side of the ingots L1 to Ln are two lateral tungsten guides 6 that keep these ingots L1 to Ln properly aligned.

Placed to the left of the first ingot L1 is a piston 3 that acts on this first ingot L1 so as to move it translationally to the right, while still being guided by the inclined plane 2 and the lateral guide 6. The movement of the ingot L1 shifts, in a cascade fashion, all the ingots placed on the inclined plane 2 until the end ingot Ln drops under gravity into a recovery tank 4 for collecting the spent ingots, which may be melted and reused.

When the end of the piston 3 which is the first end of the inclined plane 2 it is at the end of its travel, it is then actuated in the opposite direction. Secondly, a vertical piston 5 acting on a support plate, supporting a series of p fresh ingots R1 to Rp, is actuated upwards so as to present a new ingot level with the first end of the inclined plane 2. The piston 3 is then brought into contact with the lateral side of the ingot R1, which is pressed against the first ingot L1 in contact with the inclined plane 2.

Thus, it may be seen that the feeder may be supplied with ingots continuously, without interrupting the process, and keeping the surface of the ingots in use both flat and parallel to the substrate to be coated thanks to the inclined plane 2 and to the regular movement imposed by the piston 3.

To cover the majority of the intense magnetic field zone T and therefore to optimize the deposition rate, a second feeder 1' in every way identical to the feeder 1 is placed facing the second half of the zone T. Here, the piston 3' moves the second series of n ingots L'1 to L'n from right to left, the inclined plane 2' being of the opposite orientation to the inclined plane 2, but it would be quite possible to provide two feeders which are identical in all points for each half of the zone T.

It may be seen that, in this embodiment, it is possible to optimize the size of the ingots by determining their width depending on the width of the zone T.

Figure 3:
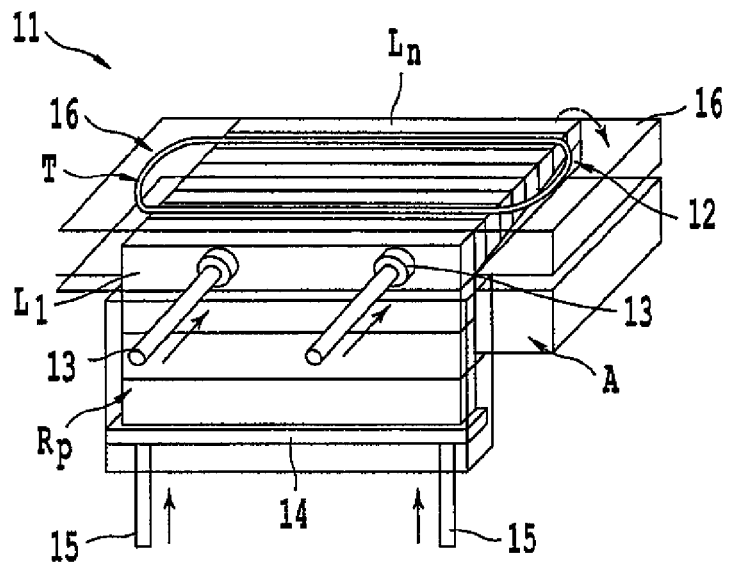
FIG. 3: a perspective view of a second embodiment of a plant according to the invention.

A second embodiment, as shown in FIG. 3, shows a feeder 11 comprising, in a similar way to the first embodiment, an inclined plane 12 supporting a series of n ingots L1 to Ln extending transversely relative to the running substrate in a horizontal plane (not shown). The environment of the feeder 11 is identical to that described in the case of FIG. 2.

The ingot L1 is moved through the action of the pistons 13, which advance the ingots L1 to Ln on the inclined plane 12 until they drop, under gravity, into a recovery tank (not shown) placed beneath the second end of the inclined plane 12.

The system is recharged with ingots by means of a plate 14 moved by two pistons 15, which plate supports a stack of p ingots R1 to Rp and operates in the same way as the device corresponding to FIG. 2. Provided on both sides of the ingots L1 to Ln are two lateral tungsten guides 16 which keep these ingots L1 to Ln properly aligned.

It may also be seen that this embodiment of the plant according to the invention allows easy adaptation to various widths of substrates to be coated since all that is required is to modify the width of the ingots and the spacing of the parts 16 in order to obtain a feeder having precisely the width necessary for the coating in progress.

Figure 4:
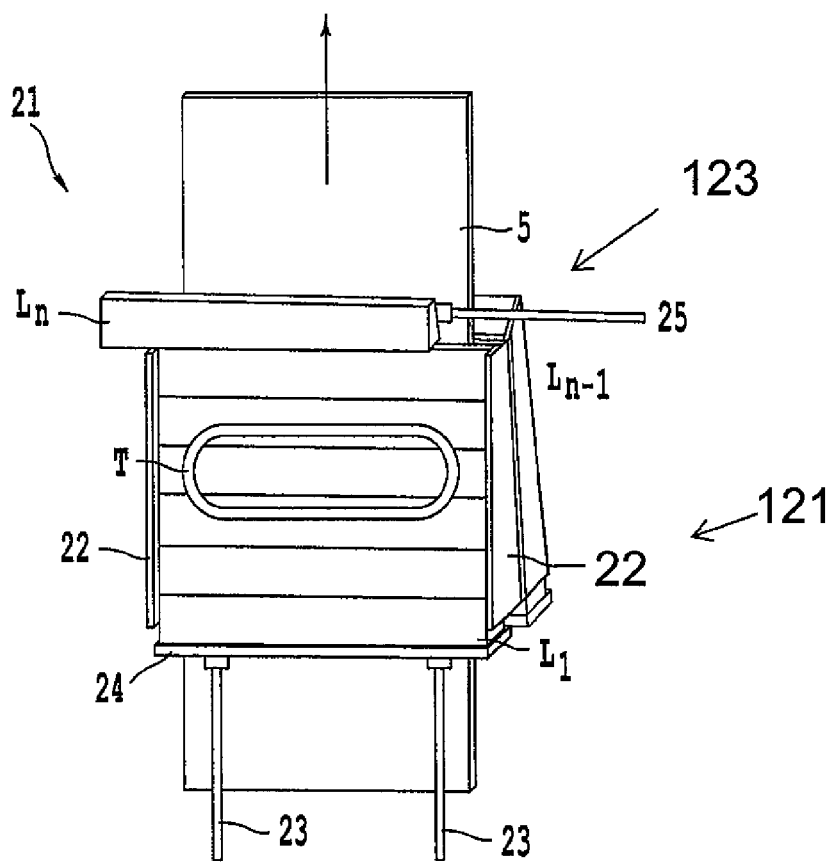
FIG. 4: a perspective view of a third embodiment of a plant according to the invention.

A third embodiment, as shown in FIG. 4, shows a feeder 21 comprising, in a similar manner to the first embodiment, two inclined planes 22 supporting a series of n ingots L1 to Ln extending transversely relative to the substrate S running in a vertical plane. These inclined planes 22 also have lateral cheek plates which ensure correct alignment of the ingots.

The ingot L1 is moved through the action of two vertical pistons 23 on a vertical plate 24, thereby advancing the ingots L1 to Ln along the inclined planes 22.

When the top ingot Ln arrives beyond the end of the inclined planes 22, a horizontal piston 25 is actuated laterally against the side of this ingot, which can thus be removed sideways.

This embodiment allows the substrate to be easily coated in a vertical position. This position also makes it possible for a two-side coating to be very easily applied by placing a feeder according to the invention on each side of the substrate, for example a feeder 121 with a vacuum evaporation 123 opposite feeder 21 shown schematically, while still being placed within the same reduced-pressure chamber.

Trials

Trials were carried out using an arrangement in accordance with the first embodiment and an SIP evaporation device. Pure zinc ingots or pure magnesium ingots 4 cm in thickness and 10 cm in width were used to coat steel strips varying in width between 50 and 200 cm. Each steel strip ran over a support roll at 100 m/min. The ingot evaporation rate was also varied.

The distance between the top side of the ingots and the steel strips to be coated was kept at 5 cm and the chamber opening, corresponding to the deposition zone in the direction in which the strip runs, was set to 40 cm. In all the trials carried out, the ingot run speed necessary for obtaining a coating thickness of around 1.5 µm was determined.

The results are given in the following three tables:

| Coating material | Zn | | | |
|---|---|---|---|---|
| Strip width (cm) | 50 | 100 | 150 | 200 |
| SIP module width (cm) | 70 | 120 | 170 | 220 |
| Evaporation rate (g/cm$^2$/s) | 0.01 | 0.01 | 0.01 | 0.01 |
| Ingot run speed (cm/min) | 2 | 3.4 | 4.8 | 6.2 |

| Coating material | Zn | | | |
|---|---|---|---|---|
| Strip width (cm) | 50 | 100 | 150 | 200 |
| SIP module width (cm) | 70 | 120 | 170 | 220 |
| Evaporation rate (g/cm$^2$/s) | 0.02 | 0.02 | 0.02 | 0.02 |
| Ingot run speed (cm/min) | 4 | 6.8 | 9.6 | 12.4 |

| Coating material | Mg | | | |
|---|---|---|---|---|
| Strip width (cm) | 50 | 100 | 150 | 200 |
| SIP module width (cm) | 70 | 120 | 170 | 220 |
| Evaporation rate (g/cm$^2$/s) | 0.002 | 0.002 | 0.002 | 0.002 |
| Ingot run speed (cm/min) | 1.6 | 2.8 | 4 | 5.2 |

These show that the ingot run speed essentially depends on the width of the strip to be coated and on the rate of evaporation of the coating material.

Similar results were obtained using arrangements in accordance with the second and third embodiments.

More generally, it was found that an ingot run speed of between 1 and 15 cm/min allowed the desired coating thickness targets to be achieved. If it is desired to achieve greater coating thicknesses, all that is then required is to pass the substrate through a series of coaters. Thus, to obtain a zinc thickness of around 7.5 µm under the evaporation conditions indicated in the above tables, five coaters would be required.

Whatever the embodiment adopted, the invention also has the advantage of not requiring the use of graphite crucibles, thereby making it possible for deposition to take place in a reactive atmosphere. This makes it possible in particular to deposit, for example, metal oxides, nitrides, sulphides and fluorides, with high deposition rates.

As was seen over the course of the description of a few preferred embodiments of the invention, the coating may especially be carried out when the substrate runs either horizontally or vertically. It goes without saying that the coating may also be carried out in any position of the substrate that would be intermediate between horizontal and vertical.

The invention claimed is:

1. A coating plant for continuously coating a substrate on at least one of its sides with a layer of a sublimable metal or metal alloy, comprising:
a vacuum chamber;
a vacuum evaporation coater located inside the vacuum chamber;
a substrate running through the vacuum evaporation coater in a plane in a first direction;
a feeder located inside the vacuum chamber for feeding the coater with a metal or metal alloy, the feeder including an inclined plane inclined in the first direction; and
a plurality of ingots on the inclined plane subliming into the metal or metal alloy, the plurality of ingots being in contact with one another and moved by the feeder up the inclined plane so that a surface of the ingots facing the side of the substrate to be coated remains parallel to and at a constant distance from the substrate as the vacuum evaporation coater evaporates the ingots while the ingots are fully on the inclined plane.

2. The coating plant according to claim 1, in which said feeder comprises a piston.

3. The plant according to claim 1, wherein said ingots are in contact with the inclined plane via their side opposite that facing said substrate, the feeder moving the ingots transversely to the first direction, the inclined plane becoming closer to the plane as the ingots move transversely to the first direction, the inclined plane compensating for evaporation of the ingots so that the surface of the ingots facing the side of the substrate remains parallel to and at a constant distance from the substrate.

4. The plant according to claim 3, in which said feeder includes at least one piston acting on a first ingot in contact with a first end of said inclined plane, and extending transversely relative to the substrate, said first ingot acting in turn on the ingots on said inclined plane as far as a second end of the inclined plane.

5. The plant according to claim 4, further comprising a second inclined plane provided with further ingots and with a second piston acting on a first further ingot in contact with the first end of said second inclined plane.

6. The plant according to claim 5, comprising two tanks for recovering, by gravity, the spent ingots, said tanks being placed beneath each second end of said inclined plane and second inclined plane.

7. The plant according to claim 1, wherein said ingots are in contact with the inclined plane via their side opposite that facing said substrate, the feeder moving the ingots in the first direction, the inclined plane becoming closer to the plane as the substrate and ingots move in the first direction, the inclined plane compensating for evaporation of the ingots so that the surface of the ingots facing the side of the substrate remains parallel to and at a constant distance from the substrate.

8. The plant according to claim 7, in which said feeder includes at least one piston acting on a first ingot in contact with a first end of said inclined plane, and extending longitudinally relative to the substrate, said first ingot acting in turn on the ingots on said inclined plane as far as a second end of the inclined plane.

9. The plant according to claim 8, comprising a tank for recovering, by gravity, the spent ingots, said tank being placed beneath said second end of the inclined plane.

10. The plant according to claim 7, in which the substrate runs vertically, said feeder comprising at least one vertical plate on which said ingots are stacked, said plate being in contact with at least one vertical piston.

11. The plant according to claim 1, further comprising a second feeder facing another side of said substrate, it being possible for each of the feeder and the second feeder to contain an identical or different metal or metal alloy, and a second vacuum evaporator facing the other side of said substrate, the second feeder and the second vacuum evaporator being placed within the vacuum chamber.

12. The plant according to claim 1, in which said vacuum chamber has a reactive atmosphere.

13. The plant according to claim 1, in which said vacuum evaporation coater is a plasma vacuum evaporation coater.

14. The plant according to claim 13, further comprising at least one magnet for confining a plasma of the evaporation coater.

15. The plant according to claim 1, in which said ingots of a metal or metal alloy are chosen from zinc, magnesium, chromium, manganese, silicon and alloys thereof.

16. A feeder for feeding a vacuum coating plant, as defined in claim 1, with a metal or metal alloy.

17. The plant according to claim 1, further comprising a support roll supporting the substrate.

18. The plant according to claim 1, further comprising a counterelectrode beneath the feeder, the substrate defining an electrode, a plasma being created between the counterelectrode and substrate.

19. The plant according to claim 1, wherein the vacuum evaporation coater sublimes the ingots.

20. The coating plant according to claim 1, wherein the plurality of ingots have heights decreasing in the first direction.

21. A coating plant for continuously coating a substrate on at least one of its sides with a layer of a sublimable metal or metal alloy, comprising:
a vacuum chamber containing:
a vacuum evaporation coater, said substrate running through the coater in a plane in a first direction; and
a feeder for feeding the coater with a metal or metal alloy, said metal or metal alloy being in the form of ingots, said ingots being in contact with one another and moved by the feeder up an inclined plane, the inclined plane compensating for evaporation of the ingots to aid in keeping a surface of said ingots facing the side of the substrate to be coated parallel to and at a constant distance from said substrate as the coater evaporates the ingots while the ingots are fully on the inclined plane.

* * * * *